(12) United States Patent
Xu et al.

(10) Patent No.: US 10,205,448 B2
(45) Date of Patent: Feb. 12, 2019

(54) SWITCH CONTROL CIRCUIT AND SWITCH CIRCUIT

(71) Applicant: JOULWATT TECHNOLOGY (HANGZHOU) CO., LTD., Hangzhou (CN)

(72) Inventors: Feng Xu, Hangzhou (CN); Pitleong Wong, Hangzhou (CN); Yuancheng Ren, Hangzhou (CN); Xunwei Zhou, Hangzhou (CN)

(73) Assignee: JOULWATT TECHNOLOGY (HANGZHOU) CO., LTD., Hangzhou (CN)

( * ) Notice: Subject to any disclaimer, the term of this patent is extended or adjusted under 35 U.S.C. 154(b) by 0 days.

(21) Appl. No.: 15/597,500

(22) Filed: May 17, 2017

(65) Prior Publication Data
US 2017/0338814 A1    Nov. 23, 2017

(30) Foreign Application Priority Data

May 19, 2016   (CN) .......................... 2016 1 0339617
May 19, 2016   (CN) .......................... 2016 1 0340039

(51) Int. Cl.
*H03K 17/284*   (2006.01)
*H03K 19/20*    (2006.01)
*H03K 17/16*    (2006.01)

(52) U.S. Cl.
CPC ......... *H03K 17/284* (2013.01); *H03K 17/166* (2013.01); *H03K 19/20* (2013.01)

(58) Field of Classification Search
CPC .............................. H03K 17/284; H03K 19/20
USPC .... 327/108–112, 427, 434, 437; 326/82, 83, 326/87; 323/282–290
See application file for complete search history.

(56) References Cited

U.S. PATENT DOCUMENTS

| | | | | |
|---|---|---|---|---|
| 5,757,214 A | * | 5/1998 | Stoddard | H01H 47/325 323/282 |
| 7,071,665 B2 | * | 7/2006 | Tzeng | H02M 1/15 323/271 |
| 7,279,869 B2 | * | 10/2007 | Tzeng | H02M 3/1563 323/222 |
| 7,876,081 B2 | * | 1/2011 | Hachiya | H02M 3/156 323/284 |
| 7,919,952 B1 | * | 4/2011 | Fahrenbruch | H02M 3/156 323/222 |
| 8,358,114 B1 | * | 1/2013 | Ferris | H02M 3/1563 323/282 |

(Continued)

*Primary Examiner* — Thomas Skibinski
(74) *Attorney, Agent, or Firm* — Perkins Coie LLP

(57) ABSTRACT

This invention provides a switch control circuit and a switch circuit. When a main transistor on-time reaches a constant on-time, whether an inductor current reaches an instruction current is detected; if the inductor current fails to reach the instruction current, the main transistor on-time is prolonged; the main transistor is turned off and the auxiliary transistor is turned on until the inductor current reaches the instruction current or exceeds the instruction current by a certain threshold; when the main transistor is turned off and the auxiliary transistor is turned on, the inductor current is detected in real time to check whether the inductor current is smaller than the instruction current, and the auxiliary transistor is turned off and the main transistor is turned on again if yes.

20 Claims, 7 Drawing Sheets

(56) References Cited

U.S. PATENT DOCUMENTS

| | | | |
|---|---|---|---|
| 8,773,099 B2* | 7/2014 | Granger | H02M 3/1588 323/284 |
| 9,525,344 B2* | 12/2016 | Chen | H02M 3/156 |
| 9,735,680 B2* | 8/2017 | Huang | H02M 3/156 |
| 9,882,475 B2* | 1/2018 | Schmitz | H02M 3/156 |
| 9,941,791 B1* | 4/2018 | Goenawan | H02M 3/158 |
| 2005/0035748 A1* | 2/2005 | Inn | H02M 3/1588 323/285 |
| 2007/0252567 A1* | 11/2007 | Dearn | H02M 3/156 323/282 |
| 2008/0030181 A1* | 2/2008 | Liu | H02M 3/157 323/283 |
| 2008/0088292 A1* | 4/2008 | Stoichita | H02M 3/156 323/285 |
| 2010/0033215 A1* | 2/2010 | Fogg | H02M 3/156 327/137 |
| 2012/0032661 A1* | 2/2012 | Nakamura | H02M 3/156 323/288 |
| 2012/0306586 A1* | 12/2012 | Wan | H02M 3/156 332/109 |
| 2014/0159689 A1* | 6/2014 | Chen | H02M 3/156 323/282 |

* cited by examiner

Figures:

(a) Topology of BUCK Circuit (b) Topology of BOOST Circuit (a) not prolong on-time (b) prolong on-time (a) not prolong off-time (b) prolong off-time

SWITCH CONTROL CIRCUIT AND SWITCH CIRCUIT

CROSS-REFERENCE TO RELATED APPLICATIONS

This Non-provisional application claims priorities under 35 U.S.C. § 119(a) on Patent Application No(s). 201610339617.5 and 201610340039.7, both of which were filed in People's Republic of China on May 19, 2016 and the entire contents of which are hereby incorporated by reference.

BACKGROUND OF THE INVENTION

Field of the Invention

This invention relates to a circuit and, more particularly, relates to a switch control circuit and a switch circuit.

Description of the Related Art

As shown in FIG. 1, by controlling a main switch transistor to turn on for constant time, the conventional constant on time (COT) control method realizes converting the input voltage into output voltage to drive a load. In a BUCK circuit of FIG. 1(a), an upper transistor M00 is a main switch transistor, and a lower transistor M01 is a freewheeling diode or an auxiliary switch transistor. In a BOOST circuit of FIG. 1(b), the lower transistor M01 is a main switch transistor, and the upper transistor M00 is a freewheeling diode or an auxiliary switch transistor.

Under the constant on time control, after the main switch transistor is turned on, the main switch transistor is turned off after a constant time. At this moment, the freewheeling diode or the auxiliary switch transistor is turned on. When the inductor current (or the current of the freewheeling diode or the auxiliary switch transistor) drops to an instruction current, the auxiliary switch transistor is turned off, and the main switch transistor is turned on again. Repeating the above steps, the waveforms of an inductor current and an instruction current are as shown in FIG. 2. Usually, in order to ensure correct detection of the inductor current and normal operation of the circuit, the main switch transistor will have a minimum off-time.

The conventional solution has the advantages of simply circuits, and it is easy to be implemented and the cost is relatively low, but mainly has the following defects: 1. Under the constant on time (COT) control, when the duty ratio is large, a current dynamic response is slow (the inductor current cannot follow the instruction current), as shown in FIG. 3; 2. Under the constant on time (COT) control, since the on-time of the main switch transistor is fixed and has a minimum off-time, the maximum duty ratio of the switch circuit is limited. Similarly, for the constant off-time (COT) control method, it has the following defects: 1. Under the constant off-time control, when the duty ratio is small, the dynamic response is slow, as shown in FIG. 3; 2. Under the constant off-time control, since the off-time of the main switch transistor is fixed and has the shortest on-time, the minimum duty ratio of the switch transistor is limited.

BRIEF SUMMARY OF THE INVENTION

This invention provides a switch control circuit and a switch circuit to realize voltage stability control of an output voltage, so as to realize a voltage conversion with a larger duty ratio in a constant on-time and a voltage conversion with a smaller duty ratio in a constant off-time.

In order to solve the above problems, embodiments of the invention provide a switch control circuit, coupled to a main transistor and an auxiliary transistor of a switch main circuit, including a logic control circuit and a current detection circuit. One end of the current detection circuit is coupled to the switch main circuit, and the other end is coupled to the logic control circuit. The current detection circuit receives an instruction current and samples a main transistor current when the main transistor is turned on, and compares the instruction current with the main transistor current. The logic control circuit counts on-time or off-time of the main transistor and controls on and off states of the main transistor. When the on-time of the main transistor reaches a constant on-time, the current detection circuit detects whether an inductor current reaches the instruction current. If the inductor current fails to reach the instruction current, the current detection circuit prolongs the on-time of the main transistor. The main transistor is turned off when the inductor current reaches the instruction current or exceeds the instruction current by a certain threshold. When on-time of the auxiliary transistor reaches a constant off-time, the current detection circuit detects whether the inductor current is smaller than the instruction current. If the inductor current is not smaller than the instruction current, the current detection circuit prolongs the off-time of the main transistor. The main transistor is turned on when the inductor current is smaller than the instruction current or smaller than the instruction current by a certain threshold.

In a preferred embodiment, the logic control circuit may be a constant on logic control circuit or a constant off logic control circuit.

In a preferred embodiment, the current detection circuit may comprise a first comparison circuit, one end of the first comparison circuit may be coupled to the main transistor of the switch main circuit, and the other end may be coupled to the logic control circuit. When the main transistor is turned on, the main transistor current of the main transistor of the switch main circuit transistor may be sampled, and the main transistor current may be compared with the instruction current.

In a preferred embodiment, the first comparison circuit may comprise a first comparator and a first current sampling circuit. The first current sampling circuit may be coupled to the main transistor. A positive input terminal of the first comparator may be coupled to the first current sampling circuit for receiving a signal of the main transistor current when the main transistor is turned on. A negative input terminal of the first comparator may receive a signal of the instruction current. An output terminal of the first comparator may be coupled to the logic control circuit.

In a preferred embodiment, the current detection circuit may comprise a second comparison circuit. One end of the second comparison circuit may be coupled to the auxiliary transistor of the main switch circuit, and the other end may be coupled to the logic control circuit. When the auxiliary transistor is turned on, an auxiliary transistor current of the auxiliary transistor of the switch main circuit may be sampled. The auxiliary transistor current may be compared with the instruction current.

In a preferred embodiment, the second comparison circuit may comprise a second comparator and a second current sampling circuit. The second current sampling circuit may be coupled to the auxiliary transistor. A positive input terminal of the second comparator may receive the instruction current. A negative input terminal of the second comparator may be coupled to the second current sampling circuit for sampling the auxiliary transistor current when the auxiliary transistor of the switch main circuit is turned on. An output terminal of the second comparator may be coupled to the logic control circuit.

In a preferred embodiment, the logic control circuit may comprise: a timing circuit coupled to the main transistor for counting the on-time of the main transistor or the auxiliary transistor; a gate circuit coupled to an output terminal of the timing circuit and the output terminal of the first comparison circuit, and the gate circuit may beat a high level only when both of the outputs of the timing circuit and the first comparison circuit are at high levels; a trigger coupled to an output terminal of the gate circuit and an output terminal of the second comparison circuit; when the output of the gate circuit is at a high level, the trigger may be reset to be at a low level; when the output of the second comparison circuit is at a high level, the trigger may be set to be at a high level; or when the output of the gate circuit is at a high level, the trigger may be set to be at a high level; and when the output of the first comparison circuit is at a high level, the trigger may be reset to be at a low level; and a time-delay circuit coupled to an output terminal of the trigger; and when the output of the trigger is at a high level, the time-delay circuit may generate a driving signal for the main transistor; when the output of the trigger is at a low level, the time-delay circuit may generate a driving signal for the auxiliary transistor.

In a preferred embodiment, the switch control circuit may further comprise a driving circuit. The driving circuit may be coupled to the logic control circuit and the switch main circuit for receiving a driving signal of the logic control circuit and controlling on or off of the main transistor and the auxiliary transistor.

In a preferred embodiment, the time-delay circuit may comprise a rising edge time-delay circuit, a falling edge time-delay circuit, and an inverter. The rising edge time-delay circuit may be coupled to an output terminal of the trigger and a control terminal of the main transistor. The falling edge time-delay circuit may be coupled to the output terminal of the trigger and an input terminal of the inverter. An output terminal of the inverter may be coupled to a control terminal of the auxiliary transistor.

In a preferred embodiment, the trigger is an RS trigger. A terminal R may be coupled to the output of the gate circuit output. A terminal S may be coupled to the output of the first comparison circuit or the output of the second comparison circuit. A terminal Q may be coupled to the time-delay circuit.

In a preferred embodiment, the gate circuit may be an AND gate circuit.

In a preferred embodiment, the switch control circuit may further comprise a third comparator. A positive input terminal thereof may receive a reference voltage. A negative input terminal of the third comparator may input a feedback voltage. An output terminal of the third comparator may be coupled to the input terminal of the current detection circuit.

In a preferred embodiment, the current detection circuit may comprise an inductor current detection circuit, a fourth comparator, and a fifth comparator. The inductor current detection circuit may be coupled to an inductor of the switch main circuit for detecting the inductor current. A positive input terminal of the fourth comparator may be coupled to the inductor current detection circuit. A negative input terminal of the fourth comparator may receive the instruction current. The output terminal of the fourth comparator may be coupled to the logic control circuit. A positive input terminal of the fifth comparator may receive the instruction current. A negative input terminal of the fifth comparator may be coupled to the inductor current detection circuit. An output terminal of the fifth comparator may be coupled to the constant on logic control circuit. Embodiments of the invention may provide a switch circuit, including: a switch main circuit, including a main transistor and an auxiliary transistor, wherein a load is supplied with power by controlling working states of the main transistor and the auxiliary transistor; and any of the above switch control circuit, coupled to the switch main circuit.

In a preferred embodiment, the auxiliary transistor may be a switch transistor or a freewheeling circuit.

In a preferred embodiment, when the auxiliary transistor is a switch transistor, the driving circuit may include a first driving circuit and a second driving circuit. The first driving circuit may be coupled to the logic control circuit and a main transistor for receiving the driving signal of the logic control circuit and controlling on or off of the main transistor, the second driving circuit may be coupled to the logic control circuit and the auxiliary transistor for receiving the driving signal of the logic control circuit and controlling on or off of the auxiliary transistor.

Compared with the prior art, the invention has the advantageous effect of prolonging the off-time of the main transistor and improving transient response when the duty ratio is large. Under the control of constant on-time, the switch main circuit can realize voltage conversion with a larger duty ratio. Under the control of constant off-time, the switch main circuit can realize the voltage conversion with a smaller duty ratio.

Reference numbers: 1. first comparison circuit; 2. second comparison circuit; 3. switch main circuit; and 4. switch control circuit.

DETAILED DESCRIPTION OF THE INVENTION

The foregoing and additional technical features and advantages of the present invention will be described clearly and completely the following description with reference to the accompanying drawings. Obviously, the described embodiments are merely part of the embodiments of the invention, rather than all of the embodiments.

Figure 6:
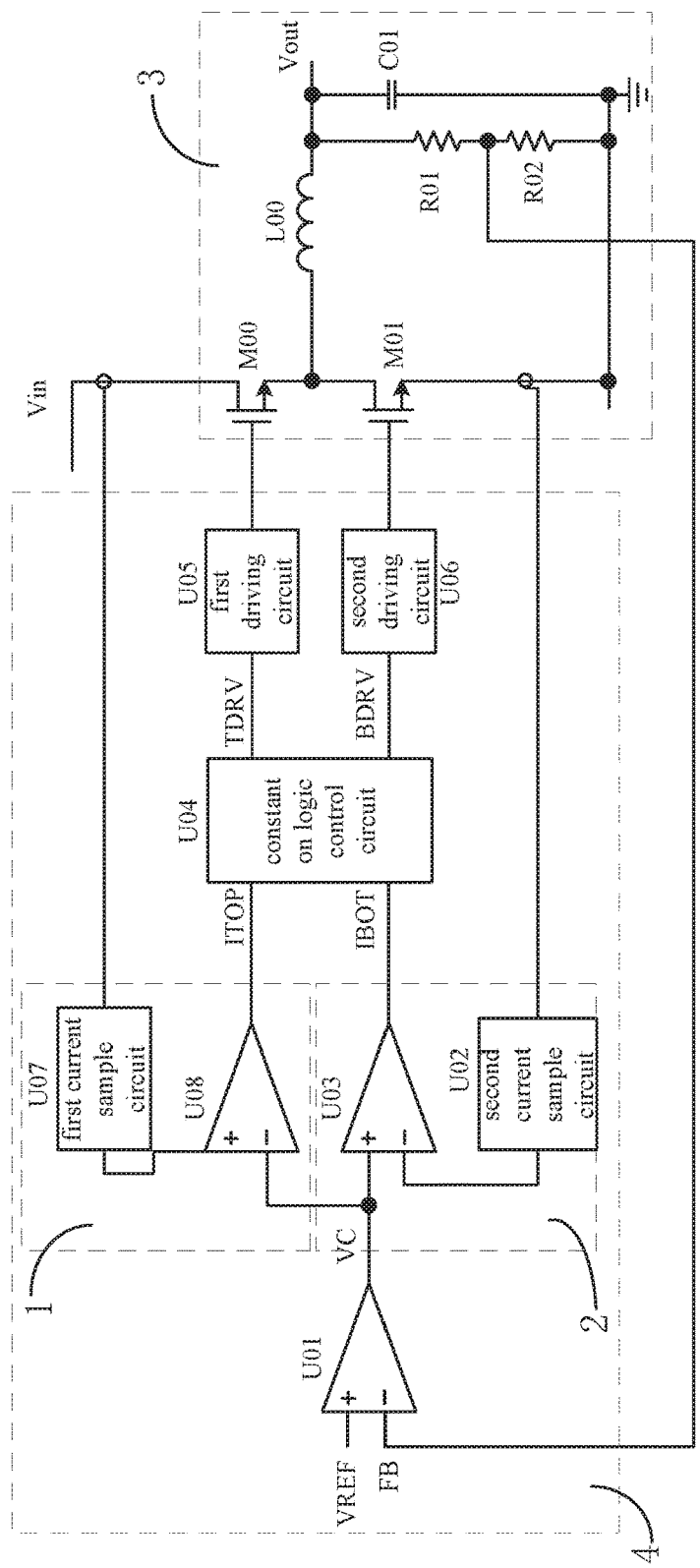
FIG. 6 is an implementing block diagram of Embodiment 1 of the switch circuit of the invention.

As shown in FIG. 6, Embodiment 1 of the invention provides a switch circuit, including a switch control circuit 4 and a switch main circuit 3. The switch control circuit 4 is coupled to the switch main circuit 3 for receiving a feedback voltage FB, sampling the currents of the main transistor M00 and an auxiliary transistor M01, and controlling on and off states of the main transistor M00 and the auxiliary transistor M01 according to an instruction current.

Embodiments of the invention provide a switch control circuit 4, including a third comparator U01, a current detection circuit, a constant on logic control circuit U04, and a driving circuit.

The positive input terminal of the third comparator U01 receives a reference voltage VREF, and the negative input terminal thereof is inputted with the feedback voltage FB, and the output terminal of the third comparator U01 outputs a compensation voltage VC. The output terminal is coupled to the input terminal of the current detection circuit. The inductor current is controlled by a compensation voltage VC, and the compensation voltage VC is the voltage value of the instruction current.

The current detection circuit includes a first comparison circuit 1 and a second comparison circuit 2. The first comparison circuit 1 includes a first comparator U08 and a first current sample circuit U07. The first current sample circuit U07 is coupled to the main transistor M00. The positive input terminal of the first comparator U08 is coupled to the first current sample circuit U07. The negative input terminal of the first comparator U08 is coupled to the output of the third comparator U01. The output terminal of the first comparator U08 is coupled to the constant on logic control circuit U04. The second comparison circuit 2 includes a second comparator U03 and a second current sample circuit U02. The second current sample circuit U02 is coupled to the auxiliary transistor M01. The positive input terminal of the second comparator U03 is coupled to the output of the third comparator U01. The negative input terminal of the second comparator U03 is coupled to the second current sample circuit U02. The output terminal of the second comparator U03 is coupled to the constant on logic control circuit U04.

The current detection circuit includes an inductor current sample circuit, a fourth comparator, and a fifth comparator. The inductor current sample circuit is coupled to an inductor of the switch main circuit for directly detecting the inductor current, rather than detecting a main transistor current and an auxiliary transistor current equal to the inductor current by the above method. The positive input terminal of the fourth comparator is coupled to the inductor current to sample the circuit output. The negative input terminal of the fourth comparator is coupled to the third comparator U01. The output terminal of the fourth comparator is coupled to the input of the constant on logic control circuit. The positive input terminal of the fifth comparator is coupled to the output of the third comparator U01. The negative input terminal of the fifth comparator is coupled to the output of the inductor current sample circuit. The output terminal of the fifth comparator is coupled to the input of the constant on logic control circuit. This method has the same principle as the aforementioned method of using the current detection circuit. They differ in that the former obtains the inductor current from the currents of the main transistor and the auxiliary transistor when they are turned on via the first current sample circuit U07 and the second current sample circuit U02, and the latter uses the inductor current sample circuit to directly sample the inductor current, which can save production cost.

The constant on logic control circuit U04 includes a timing circuit U10, a gate circuit U11, a trigger U12, and a time-delay circuit. The timing circuit U10 is coupled to the main transistor M00 for counting the on-time of the main transistor M00. The gate circuit U11 adopts an AND gate circuit. The two ends of its inputs are coupled to the output terminal of the timing circuit U10 and the output terminal of the first comparison circuit 1, and the output of the gate circuit U11 is at a high level only when the output of the timing circuit U10 and the output of the first comparison circuit 1 are both at high levels. The trigger U12 adopts an RS trigger. The terminal R is coupled to the output of the gate circuit U11, and the terminal S is coupled to the output of the second comparison circuit 2, and the terminal Q is coupled to the time-delay circuit. When the output of the gate circuit U11 is at a high level, the trigger U12 is reset to be at a low level. When the output of the second comparison circuit 2 is at a high level, the trigger U12 is set to be at high level. The time-delay circuit includes a rising edge time-delay circuit U13, a falling edge time-delay circuit U14, and an inverter U15. One end of the rising edge time-delay circuit U13 is coupled to the output terminal of the trigger U12, and the other end is coupled to the control terminal of the main transistor M00. One end of the falling edge time-delay circuit U14 is coupled to the output terminal of the trigger U12, and the other end is coupled to the input terminal of the inverter U15. The output terminal of inverter U15 is coupled to the control terminal of the auxiliary transistor M01. When the output of the trigger U12 is at a high level, a driving signal for the main transistor M00 is generated. When the output of the trigger U12 is at a low level, a driving signal for the auxiliary transistor M01 is generated.

One end of the driving circuit is coupled to the output of the constant on logic control circuit U04, and the other end is coupled to the control terminal of the switch transistor for receiving a driving signal of the constant on logic control circuit U04 and controlling on or off of the main transistor M00 and the auxiliary transistor M01. If the auxiliary transistor M01 is a switch transistor, the driving circuit includes a first driving circuit U05 and a second driving circuit U06. One end of the first driving circuit U05 is coupled to the output terminal of the constant on logic control circuit U04, and the other end is coupled to the control electrode of the main transistor M00 for receiving the driving signal of the constant on logic control circuit U04 and controlling the on or off of the main transistor M00. One end of the second driving circuit U06 is coupled to the constant on logic control circuit U04, and the other end is coupled to the control electrode of the auxiliary transistor M01 for receiving the driving signal of the constant on logic control circuit U04 and controlling the on or off of the auxiliary transistor M01.

The switch main circuit 3 may be any one of the switch circuits, e.g., a Buck circuit, a Boost circuit, a forward circuit or a flyback circuit, etc. No matter w kind of circuit it is, the switch main circuit 3 includes the main transistor M00, the auxiliary transistor M01, and the inductor L00. During the constant on-time control, by controlling the transistor M00 to be turned on for constant time, the input voltage is converted into the output voltage to drive the load. The output terminal of the switch main circuit 3 is set with two voltage-dividing resistors (R01, R02), and the connection node of the two voltage-dividing resistors outputs the feedback voltage FB and is connected to the negative input terminal of the third comparator U01. In the present invention, the main transistor M00 is a switch transistor, and the auxiliary transistor M01 is a switch transistor or a freewheeling diode.

In the invention, take the BUCK circuit as an example. As shown in FIG. 6, under the BUCK constant on-time control, M00 is the main transistor of the BUCK circuit, and M01 is the auxiliary transistor. Output voltage-dividing resistors R01, R02 divide the output voltage, and the voltage dividing point is an output voltage feedback point which outputs a feedback voltage FB. The feedback voltage FB is outputted to the negative input terminal of the third comparator U01. The positive input terminal of the third comparator U01 is inputted a reference voltage VREF, and the output is a compensation voltage VC (the value indicates a voltage value of the instruction current). The inductor current is controlled by the compensation voltage VC to make the voltage FB of the output voltage feedback terminal to be equal to the reference voltage VREF. The constant on logic control circuit U04 controls the first driving circuit U05 to make the main transistor M00 to turn on and controls the second driving circuit U06 to make the auxiliary transistor M01 to turn off. At this time the current of the main transistor M00 is the inductor current. The constant on logic control circuit U04 counts the on-time of the transistor M00. When the output ITOP of the first comparator U08 is positive, i.e., the current of the main transistor M00 is greater than the instruction current, (1) if the constant on logic control circuit U04 counts the on-time of the transistor M00 to reach the constant on-time, the constant on logic control circuit U04 turns off the main transistor M00, and the auxiliary transistor M01 is turned on; after the main transistor M00 is turned off, a certain period of dead time needs to be inserted to make the auxiliary transistor to be turned on again to prevent the main transistor M00 and auxiliary transistor M01 from being turned on directly; (2) if the constant logic control circuit U04 counts that the on-time of the main transistor M00 does not reach the constant on-time, then after it reaches the constant on-time, the constant on logic circuit U04 turns off the main transistor M00 again. When the main transistor M00 is turned off and the auxiliary transistor M01 is turned on, the value of the current of the auxiliary transistor M01 is the value of the inductor current. When the auxiliary transistor M01 is turned on, the second current sample circuit U02 samples the current of the auxiliary transistor M01 and converts the current into a voltage, and then outputs to the negative input terminal of the second comparator U03. The compensation voltage VC is inputted to the positive input terminal of the second comparator U03. When the current of the auxiliary transistor M01 is smaller than the instruction current, i.e., when the output of the auxiliary transistor current sample circuit is lower than the compensation voltage VC, the output of the second comparator U03 is turned over from the negative voltage to positive voltage. The output voltage IBOT is connected to the input of the constant on logic control circuit U04. The constant on logic control circuit U04 controls the second driving circuit U06 to turn off the auxiliary transistor M01, and controls the first driving circuit U05 to turn on the main transistor M00. After the auxiliary transistor M01 is turned off, it needs to be inserted for a certain dead zone time, to make the main transistor M00 to be turned on and prevent the main transistor M00 and auxiliary transistor M01 from being turned on directly. The on-time of the main transistor M00 is prolonged by the first sample circuit U07 and the first comparator U08. When the main transistor M00 is turned on, the first sample circuit U07 samples the current of the main transistor M00 and converts the current into a voltage and outputs it to the positive input terminal of the first comparator U08. The compensation voltage VC is inputted to the negative input terminal of the first comparator U08. When the main transistor M00 is turned on, the constant on logic control circuit U04 counts the on-time of the main transistor M00. When the on-time of the main transistor M00 reaches the certain time constant on-time, if the inductor current is smaller than the instruction current, i.e., the output of the first current sample circuit U07 is smaller than the compensation voltage VC, and the output of the first comparator U08 is negative, then the constant on logic circuit U04 controls the first driving circuit U05 to turn on all the time. The main transistor M00 is turned off when the output of the first current sample circuit U07 is greater than the compensation voltage VC and the output of the first comparator U08 is positive. The auxiliary transistor M01 is turned on. At this time the constant on logic circuit U04 controls the first driving circuit U05 to make the off-time of the main transistor M00 to be the shortest off-time tOFF_min.

Figure 7:
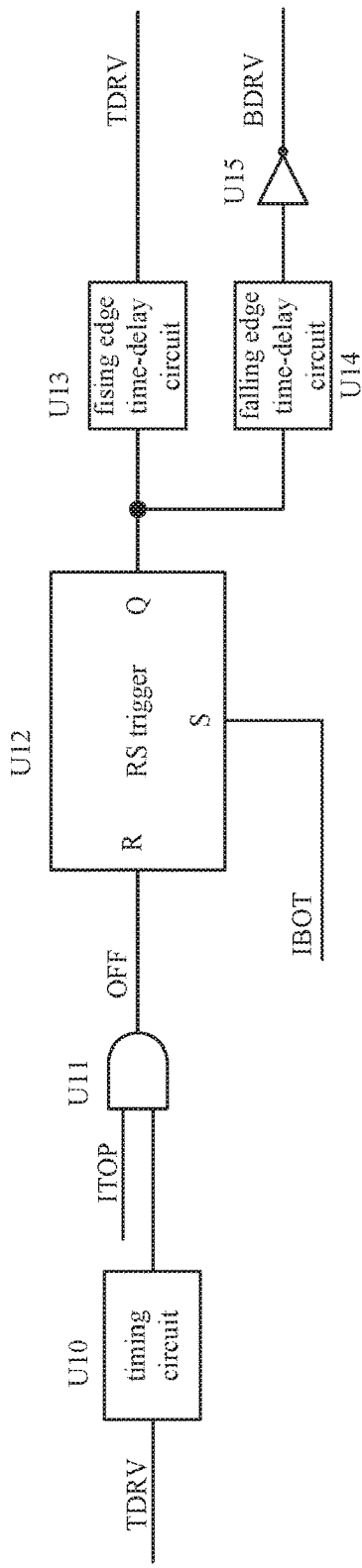
FIG. 7 is a circuit diagram of the constant on logic control circuit in Embodiment 1 of the invention.

In the present invention, the circuit for implementing the method of the constant on logic control circuit U04 of Embodiment 1 is as shown in FIG. 7. In the following illustration, 1 denotes the high level, and 0 denotes the low level. The driving signal of the main transistor M00 is TDRV. When the TDRV is 1, the first driving circuit U05 controls the main transistor M00 to turn on. The driving signal of the auxiliary transistor M01 is BDRV. When the BDRV is 1, the second driving circuit U06 controls the auxiliary transistor M01 to turn on. When the TDRV is 1, the main transistor M00 is turned on and the output of the timing circuit U10 is 0. The timing circuit U10 counts the on-time of the main transistor M00. When it counts to the constant on-time, its output is 1. The output of the timing circuit U10 and the ITOP signals are the inputs of the AND gate circuit U11. When the two inputs of the AND circuit U11 are both 1, the output is 1, otherwise the output is 0. That is, if the current of the main transistor is greater than the instruction current and when the conduction-time of the main transistor is greater than the constant on-time, the output signal OFF of the AND gate circuit U11 is 1, otherwise OFF is 0. The OFF signal is inputted to the terminal R of the RS trigger U12, and the output terminal Q is reset, i.e., when OFF signal is 1, the output Q is reset to 0. The IBOT signal is inputted to terminal S of the RS trigger, and the output terminal Q is set, i.e., when IBOT signal is 1, the output Q is set to 1. When the output Q of the RS trigger U12 is 1, a driving signal TDRV of the main transistor M00 is generated through the rising edge time delay circuit U13. The rising edge time delay is inserted with a dead time to prevent the directly turn-on of the main transistor M00 and the auxiliary transistor M01. When the output Q of the RS trigger U12 is 0, a driving signal BDRV of the auxiliary transistor M01 is generated by the falling edge time-delay circuit U14 and the inverter U15. The falling edge time delay is inserted with dead time to prevent the directly turn-on of the main transistor M00 and the auxiliary transistor M01.

Figure 1:
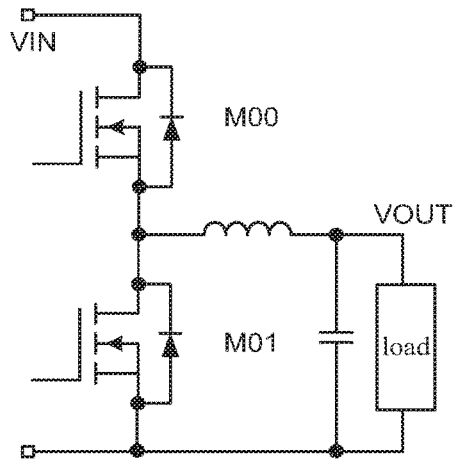
FIG. 1 is a circuit diagram of a conventional switch circuit.
Figure 1:
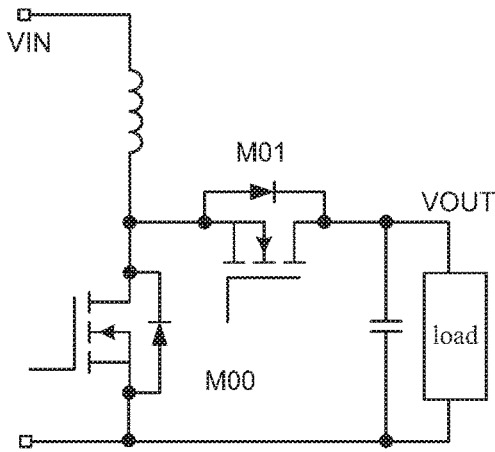
Figure 2:
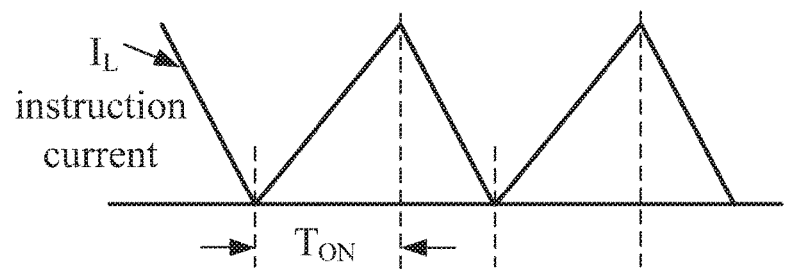
FIG. 2 is a waveform graph of an inductor current and an instruction current of the conventional switch circuit.
Figure 3:
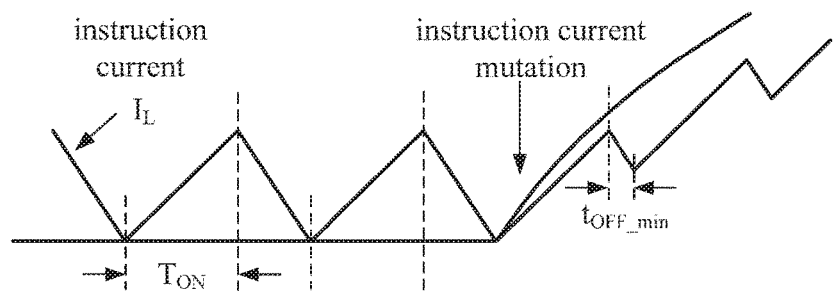
FIG. 3 is a waveform of the inductor current and the instruction current of the conventional switch circuit during a load jump.
Figure 4:
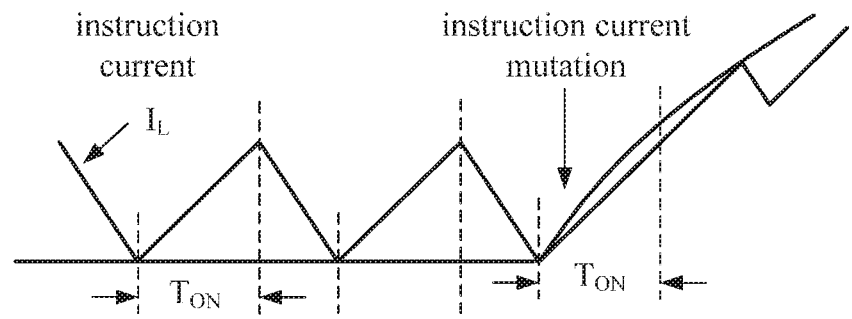
FIG. 4 is a waveform of an inductor current and an instruction current during a load jump of Embodiment 1 of a switch circuit of the invention.

As shown in FIG. 4, in the constant on-time control, when the switch circuit works at a stable state, the on-time control circuit controls the main transistor M00 in the switch circuit to turn on for constant on-time TON. If the switch circuit responses dynamically, e.g., responding according to a load jump, etc., the instruction current increases suddenly, and if within a constant on-time and the inductor current does not reach the instruction current, the on-time of the main transistor M00 is prolonged. The main transistor M00 is allowed to be turned off when the inductor current reaches the instruction current or exceeds the instruction current by a certain threshold.

Figure 5:
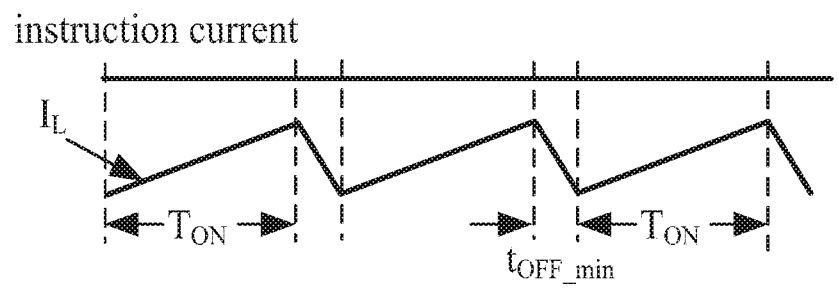
FIG. 5 is a waveform graph of the inductor current and the instruction current at a stable state in the conventional switch circuit and Embodiment 1 of the switch circuit of the invention.
Figure 5:
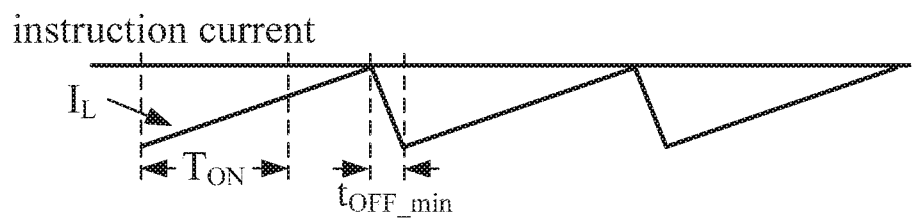

As shown in FIG. 5, in the constant on-time control, since the main transistor M00 has the minimum off-time and the on-time thereof is constant, the duty ratio of the switch circuit is limited. Here the output voltage does not reach the set output voltage value. Thus the instruction current is increased, and if the inductor current does not reach the amplitude of the instruction current, the output voltage cannot be stabilized to the set output voltage value. If within a constant on-time and the inductor current does not reach the instruction current, the on-time of the switch transistor is allowed to be prolonged. When the inductor current reaches the instruction or exceeds the instruction current by a certain threshold, the main transistor M00 is allowed to turn off to realize the stable voltage control of the voltage, so as to realize voltage conversion with a larger duty ratio.

Embodiments of the present invention provide a constant on-time control method, including the following steps:

The first step: when the main transistor on-time reaches the constant on-time, detecting whether the inductor current reaches the instruction current. If the inductor current does not reach the instruction current, the main transistor on-time is prolonged. The main transistor is turned off and the auxiliary transistor is turned on when the inductor current reaches the instruction current or exceeds the instruction by a certain time period.

The second step: when the main transistor is turned off and the auxiliary transistor is turned on, detecting in real-time whether the inductor current is lower than the instruction current. If yes, the auxiliary transistor is turned off and the main transistor is turned on again.

Figure 10:
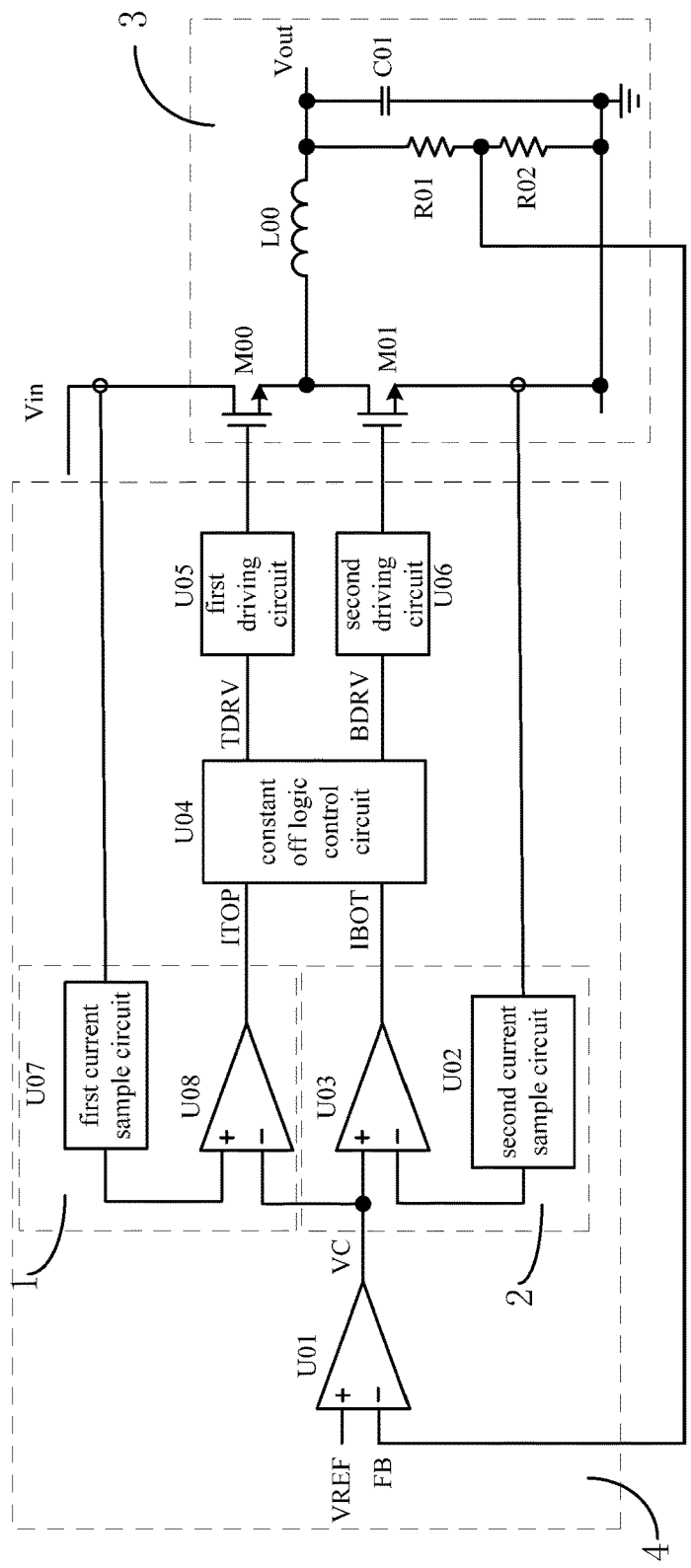
FIG. 10 is an implementing block diagram of Embodiment 2 of the switch circuit of the invention.

As show in FIG. 10, Embodiment 2 of the invention provides a switch circuit, including a switch control circuit 4 and a switch main circuit 3. The switch control circuit 4 is coupled to the switch main circuit 3 for receiving a feedback voltage FB, sampling the currents of a main transistor M00 and an auxiliary transistor M01, and controlling the on and off states of the main transistor M00 and the auxiliary transistor M01 by an instruction current.

Embodiments of the present invention provide a switch control circuit 4, including a third comparator U01, a current detection circuit, a constant off logic control circuit U04, and a driving circuit.

The positive input terminal of the third comparator U01 receives a reference voltage VREF. The negative input terminal of the third comparator U01 is inputted with the feedback voltage FB of dividing-voltage resistors R01 and R02 of a switch main circuit 3. An output terminal of the third comparator U01 outputs a compensation voltage VC. The output terminal is coupled to an input terminal of a current detection circuit, and controls the amplitude of the inductor current by a compensation voltage VC. The compensation voltage VC is a voltage value of the instruction current.

The current detection circuit includes a first comparator circuit 1 and a second comparator circuit 2. The first comparator circuit 1 includes a first comparator U08 and a first current sample circuit U07. The first current sample circuit U07 is coupled to the main transistor M00. A first positive input terminal of the first comparator U08 is coupled to the first current sample circuit U07, and a negative input terminal is coupled to the output of the third comparator U01, and the output terminal is coupled to the constant off logic control circuit U04. The second comparator circuit 2 includes a second comparator U03 and a second current sample circuit U02. The second current sample circuit U02 is coupled to the auxiliary transistor M01. A positive input terminal of the second comparator U03 is coupled to the output of the third comparator U01, and a negative input terminal is coupled to the second current sample circuit U02, and an output terminal is coupled to the constant off logic control circuit U04.

The current detection circuit includes an inductor current sample circuit, a fourth comparator and a fifth comparator, the inductor current sample circuit is coupled to an inductor of the switch main circuit, to directly detect amplitude of the inductor current, rather than detecting the current of the main transistor and the current of the auxiliary transistor equal to the inductor current in the above manners. A positive input terminal of the fourth comparator is coupled to the output of the inductor current sample circuit, and a negative input terminal is coupled to the output of the third comparator U01, and an output terminal is coupled to the input of the constant on logic control circuit. A positive input terminal of the fifth comparator is coupled to the output of the third comparator U01, a negative input terminal is coupled to the output of inductor current sample circuit, and an output terminal is coupled to the input of the constant on logic circuit. The method is the same as the above current detection circuit, and they differ in that the former obtains the inductor current from the currents of the main transistor and the auxiliary transistor when they are turned on via the first current sample circuit U07 and the second current sample circuit U02, and the latter uses the inductor current sample circuit to directly sample the inductor current, which can save production cost.

The constant off logic control circuit U04 includes a timing circuit U10, a gate circuit U11, a trigger U12 and a time delay circuit. The timing circuit U10 is coupled to the auxiliary transistor M01 to count the on-time of the auxiliary transistor M01. The gate circuit U11 uses the AND gate circuit, and two ends of the input are coupled to an output terminal of the timing circuit U10 and an output terminal of the second comparison circuit 2, and the output thereof is at a high level only when the output of both the timing circuit U10 and the second comparison circuit 2 are at high levels. The trigger U12 uses an RS trigger. Its Terminal S is coupled to the gate circuit output, and its Terminal R is coupled to the output of the first comparison circuit 1, and its Terminal Q is coupled to the time-delay circuit. When the output of gate circuit U11 is at a high level, the trigger U12 is reset to be at a low level; when the output of the second comparison circuit 2 is at a high level, the trigger U12 is set to be at a high level. The time delay circuit comprises a rising edge time-delay circuit U13, a falling edge time-delay circuit U14, and an inverter U15. One end of the rising edge time-delay circuit U13 is coupled to an output terminal of trigger U12, and the other end is coupled to the control terminal of main transistor M00. One end of the falling edge time-delay circuit U14 is coupled to the output terminal of trigger U12, and the other end is coupled to the input terminal of the inverter U15. The output terminal of the inverter U15 is coupled to the control terminal of the auxiliary transistor M01. A driving signal of the main transistor M00 is generated when the output of trigger U12 is at a high level, and a driving signal of the auxiliary transistor M01 is generated when the output of trigger U12 is at a low level.

The driving circuit includes a first driving circuit U05 and a second driving circuit U06. One end of the first driving circuit U05 is coupled to the output terminal of the constant off logic control circuit U04, and the other end is coupled to the control terminal of main transistor M00, to receive the driving signals of the constant off logic control circuit U04 for controlling on or off of the main transistor M00. One end of the second driving circuit U06 is coupled to the constant off logic control circuit U04, and the other end is coupled to the control electrode of auxiliary transistor M01, to receive the driving signals of the constant off logic circuit M14 for controlling the on or off of the auxiliary transistor M01.

The switch main circuit 3 may be any switch circuit, e.g., a Buck circuit, a Boost circuit, a forward circuit or a flyback circuit, etc. No matter what kind of circuit it is, the switch main circuit 3 includes a main transistor M00, an auxiliary transistor M01, and an inductor L00. In the constant off-time control, by turning off the main transistor to at constant time, realizing the conversion of input voltage into output voltage to drive the load. The output terminal of the switch main circuit 3 is set with two voltage-dividing resistors (R01, R02). The connection node of the two voltage-dividing resistors outputs a feedback voltage FB to the negative input terminal of the third comparator U01. In this embodiment, the main transistor M00 is a switch transistor, and the auxiliary transistor M01 is also a switch transistor.

In the invention, take BUCK circuit as an example. As shown in FIG. 10, in the BUCK constant off-time control, the constant off logic control circuit U04 controls the first driving circuit U05 to turn off the main transistor M00, and controls the second driving circuit U06 to turn on the auxiliary transistor M01. At this time the current of the auxiliary transistor M01 is the inductor current. The constant off logic control circuit U04 counts the on-time of the auxiliary transistor M01. If the output IBOT of the second comparator U03 is positive, i.e., the current of the auxiliary transistor M01 is smaller than an instruction current, and at this time if the constant off logic control circuit U04 counts that the on-time of the auxiliary transistor M01 reaches the constant off-time, the constant off logic control circuit U04 turns off the auxiliary transistor M01 and the main transistor M00 is turned on. After the auxiliary transistor M01 is turned off, it needs to inserted with a certain dead time, to make the main transistor M00 to be turned on again to prevent the main transistor and the auxiliary transistor from being connected to the ground directly. If the constant off logic control circuit U04 counts that the on-time of the auxiliary transistor M01 does not reach the constant off-time, after it reaches the constant off-time, the constant off logic control circuit U04 turns off the auxiliary transistor M01 again. When the auxiliary transistor M01 is turned off and the main transistor M001 is turned on, the magnitude of the current of the main transistor M00 is the magnitude of the inductor current. When the main transistor M00 is turned on, the first current sample circuit U07 samples the current of main transistor M00, and converts the current into voltage, and outputs the voltage to the positive input terminal of the first comparator U08. The compensation voltage VC is inputted to the negative input terminal of the first comparator U08. When the current of the main transistor M00 is greater than the instruction current, i.e., the output of the first current sample circuit U07 is higher than the compensation voltage VC, the output of the first comparator U08 is turned over from negative voltage to positive voltage, and the output voltage ITOP is inputted to the input of the constant off logic control circuit U04. At this time the constant off logic control circuit U04 controls the first driving circuit U05 to turn off the main transistor M00, and controls the second driving circuit U06 to turn on the auxiliary transistor M01. After the main transistor M00 is turned off, it needs to be inserted into a certain dead time to make the auxiliary transistor M01 turned on again, for preventing the main transistor M00 and the auxiliary transistor M01 connected to the ground directly. The prolonging of the off-time of the main transistor M00 is realized by the auxiliary transistor M01 of the second current sampling circuit U02 and the second comparator U03. When the auxiliary transistor M01 is turned on, the second current sample circuit U02 samples the current of the auxiliary transistor M01, and converts the current into the voltage, and outputs the voltage to the negative input terminal of the second comparator U03. The compensation voltage VC is inputted to the positive input terminal of the second comparator U03. When the auxiliary transistor M01 is turned on, if the constant off logic circuit U04 counts that the on-time of the auxiliary transistor M01 reaches the constant off-time and the inductor current is greater than the instruction current, i.e., the output of the second current sample circuit U02 is greater than the compensation voltage VC and the output of the second comparator U03 is negative, then the constant off logic control circuit U04 controls the second driving circuit U06 to turn on all the time. When the output of the second current sample circuit U02 is smaller than the compensation voltage VC and the output of the second comparator U03 is positive, the auxiliary transistor M01 is turned off and the main transistor M00 is turned on. At this time the constant off logic control circuit U04 controls the first driving circuit U05 to make the on-time of main transistor M00 to be the minimum on-time tON_min.

Figure 11:
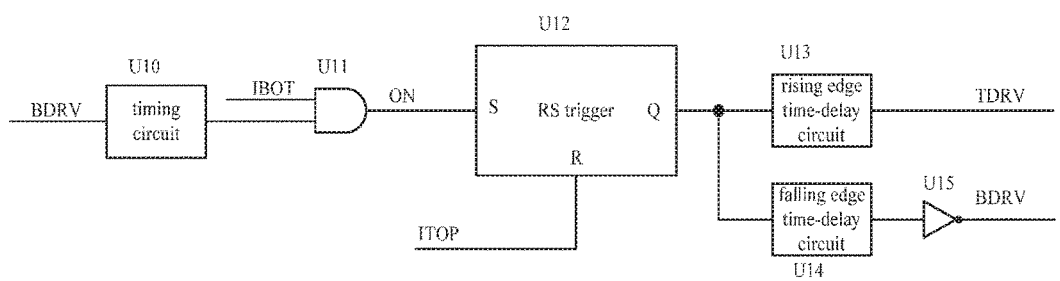
FIG. 11 is a circuit diagram of a constant off logic control circuit in Embodiment 2 of the invention.

In the invention, the implementing manner of the circuit of the constant off logic control circuit U04 in Embodiment 2 is as shown in FIG. 11. In the following illustration, 1 denotes high level, and 0 denotes low level. The driving signal of the main transistor M00 is TDRV. When the TDRV is 1, the first driving circuit U05 controls the main transistor M00 to turn on. The driving signal of the auxiliary transistor M01 is BDRV. When the BDRV is 1, the second driving circuit U06 controls the auxiliary transistor M01 to turn on. When the BDRV is 1, the auxiliary transistor M01 is turned on, and the output of the timing circuit U10 is 0, and the timing circuit U10 counts the on-time of the auxiliary transistor M01. When the timing circuit U10 counts to the constant off-time, the output is 1. The outputs of the timing circuit U10 and IBOT signal are the inputs of the AND gate U11. When the two inputs of the AND gate circuit U11 is 1, the output is 1, otherwise, the output is 0. That is, if the current of the auxiliary transistor M01 is smaller than the instruction current and the on-time of the auxiliary transistor M01 is greater than the constant off-time, an output signal ON of the AND gate circuit U11 is 1, otherwise ON is 0. The ON signal is inputted to the terminal S of the RS trigger U12 to set the output terminal Q, i.e., when signal ON is 1, the output Q is set to 1. ITOP signal is inputted to the terminal R of the RS trigger U12, and the output Q is reset, i.e., when the ITOP signal is 1, the output Q is reset to 0. When the output Q of the RS trigger U12 is 1, a driving signal TDV of the main transistor M00 is generated by the rising edge time delay circuit U13, and the rising edge time delay is inserted with a dead time to prevent the main transistor M00 and the auxiliary transistor M01 from being turned on directly. When the output Q of the RS trigger U12 is 0, the driving signal BDRV of the auxiliary transistor M01 is generated by the falling edge time-delay circuit U14 and the inverter U15, and the falling edge time-delay is inserted with a dead time to prevent the main transistor M00 and the auxiliary transistor M01 from being turned on directly.

Figure 8:
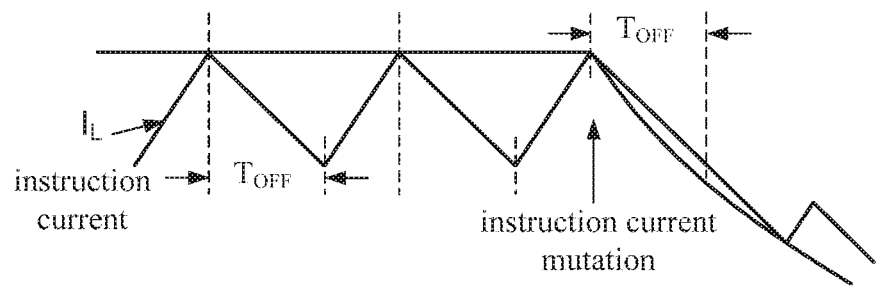
FIG. 8 is a waveform graph of an inductor current and an instruction current during a load jump in Embodiment 2 of a switch circuit of the invention.

As shown in FIG. 8, during the constant off-time control, when the switch circuit works at stable state, the off-time control circuit controls the main transistor M00 in the switch circuit to turn off at the constant off-time TOFF. When the switch circuit responses dynamically, e.g., responding to a load jump, etc., the instruction current decreases suddenly. If within a constant off-time, the inductor current obtained by the current sample module is greater than the instruction current, the off-time of the main transistor is allowed to be prolonged. The main transistor M00 is allowed to be turned on when the inductor current is smaller than the instruction current or smaller than the instruction current by a certain threshold.

Figure 9:
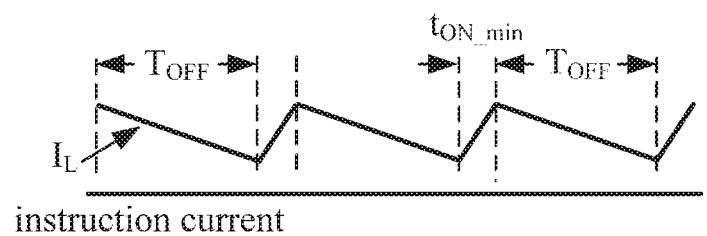
FIG. 9 is a waveform of the inductor current and the instruction current at a stable state in the conventional switch circuit and Embodiment 2 of the switch circuit of the present invention.
Figure 9:
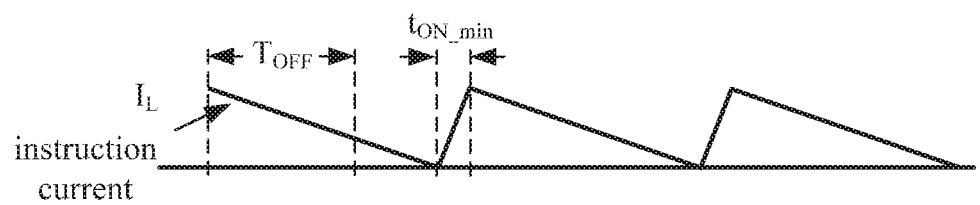

As shown in FIG. 9, in the constant off-time control, since the main transistor M00 has a minimum on-time, and the off-time is constant, the duty ratio of the switch circuit is thus limited. Herein the output voltage is higher than the set output voltage value. Thus, the instruction current is reduced, the inductor current does not reach the instruction current, and the output voltage is not voltage-stabled to the set output voltage value. If in a constant off-time, the inductor current does not reach the instruction current, the off-time of the main transistor M00 is allowed to be prolonged. When the inductor current reaches the instruction current or lower than the instruction by a certain threshold, and the main transistor M00 is allowed to be turned on to realize the stable voltage control of the output voltage, so as to realize the voltage conversion of smaller duty ratio.

Embodiments of the present invention provide a constant off-time control method, including the following steps:

The first step: when the on-time of the auxiliary transistor reaches the constant off-time, detecting whether the inductor current reaches the instruction current. If the inductor current is not smaller than the instruction current, the off-time of the main transistor is prolonged. The main transistor is turned on and the auxiliary transistor is turned off when the inductor current is smaller than the instruction current or smaller than the instruction by a certain threshold.

The second step: when the main transistor is turned on and the auxiliary transistor is turned off, detecting in real time to check whether the inductor current exceeds the instruction current. If yes, the auxiliary transistor is turned on, and the main transistor is turned off again.

The above specific embodiments make a further illustration on the objective, the technical solutions and the advantageous effects of the invention. It shall be noticed that the above are merely specific embodiments of the invention, rather than restricting the protection scope of the present invention. It is particularly pointed out that any amendment, equivalent replacement and improvement made within the spirits and principles of the above invention shall be contained in the protection scope of the invention.

What is claimed is:

1. A switch control circuit, wherein a main transistor and an auxiliary transistor coupled to a switch main circuit, the switch control circuit comprising a logic control circuit and a current detection circuit, one end of the current detection circuit being coupled to the switch main circuit and the other end being coupled to the logic control circuit, the current detection circuit receiving an instruction current, sampling a main transistor current when the main transistor is turned on, and comparing the instruction current with the main transistor current, the logic control circuit counting on-time or off-time of the main transistor and controlling on and off states of the main transistor; and when the on-time of the main transistor reaches a constant on-time, detecting whether an inductor current reaches the instruction current, prolonging the on-time of the main transistor if the inductor current fails to reach the instruction current, and turning off the main transistor when the inductor current reaches the instruction current or exceeds the instruction current by a certain threshold; or when on-time of the auxiliary transistor reaches a constant off-time, detecting whether the inductor current is smaller than the instruction current, prolonging the off-time of the main transistor if the inductor current is not smaller than the instruction current, and turning on the main transistor when the inductor current is smaller than the instruction current or smaller than the instruction current by a certain threshold.

2. The switch control circuit of claim 1, wherein the logic control circuit is a constant on logic control circuit or a constant off logic control circuit.

3. The switch control circuit of claim 2, the current detection circuit comprising a first comparison circuit, one end of the first comparison circuit being coupled to the main transistor of the switch main circuit and the other end being coupled to the logic control circuit, and when the main transistor is turned on, sampling the main transistor current of the main transistor of the switch main circuit and comparing the main transistor current with the instruction current.

4. A switch circuit, comprising:
the switch main circuit, comprising the main transistor and the auxiliary transistor, wherein a load is supplied with power by controlling working states of the main transistor and the auxiliary transistor; and
the switch control circuit according to claim 2, coupled to the switch main circuit.

5. The switch control circuit of claim 1, the current detection circuit comprising a first comparison circuit, one end of the first comparison circuit being coupled to the main transistor of the switch main circuit and the other end being coupled to the logic control circuit, and when the main transistor is turned on, sampling the main transistor current of the main transistor of the switch main circuit and comparing the main transistor current with the instruction current.

6. The switch control circuit of claim 5, wherein the first comparison circuit comprises a first comparator and a first current sampling circuit, the first current sampling circuit is coupled to the main transistor, a positive input terminal of the first comparator is coupled to the first current sampling circuit for receiving a signal of the main transistor current when the main transistor is turned on, a negative input terminal of the first comparator receives a signal of the instruction current, and an output terminal of the first comparator is coupled to the logic control circuit.

7. A switch circuit, comprising:
the switch main circuit, comprising the main transistor and the auxiliary transistor, wherein a load is supplied with power by controlling working states of the main transistor and the auxiliary transistor; and the switch control circuit according to claim 6, coupled to the switch main circuit.

8. The switch control circuit of claim 5, the current detection circuit comprising a second comparison circuit, one end of the second comparison circuit being coupled to the auxiliary transistor of the main switch circuit and the other end being coupled to the logic control circuit, and when the auxiliary transistor is turned on, sampling an auxiliary transistor current of the auxiliary transistor of the switch main circuit and comparing the auxiliary transistor current with the instruction current.

9. The switch control circuit of claim 8, wherein the second comparison circuit comprises a second comparator and a second current sampling circuit, the second current sampling circuit is coupled to the auxiliary transistor, a positive input terminal of the second comparator receives the instruction current, a negative input terminal of the second comparator is coupled to the second current sampling circuit for sampling the auxiliary transistor current when the auxiliary transistor of the switch main circuit is turned on, and an output terminal of the second comparator is coupled to the logic control circuit.

10. A switch circuit, comprising:
the switch main circuit, comprising the main transistor and the auxiliary transistor, wherein a load is supplied with power by controlling working states of the main transistor and the auxiliary transistor; and
the switch control circuit according to claim 9, coupled to the switch main circuit.

11. The switch control circuit of claim 8, wherein the logic control circuit comprises:
a timing circuit, coupled to the main transistor for counting the on-time of the main transistor or the auxiliary transistor;
a gate circuit, coupled to an output terminal of the timing circuit and the output terminal of the first comparison circuit, and the gate circuit is at a high level only when output of the timing circuit and output of the first comparison circuit are both at high levels;
a trigger, coupled to an output terminal of the gate circuit and an output terminal of the second comparison circuit, when output of the gate circuit is at a high level, the trigger is reset to be at a low level, when output of the second comparison circuit is at a high level, the trigger is set to be at a high level; or when the output of the gate circuit is at a high level, the trigger is set to be at a high level, and when the output of the first comparison circuit is at a high level, the trigger is reset to be at a low level; and
a time-delay circuit, coupled to an output terminal of the trigger, and when output of the trigger is at a high level, the time-delay circuit generates a driving signal for the main transistor; when the output of the trigger is at a low level, the time-delay circuit generates a driving signal for the auxiliary transistor.

12. The switch control circuit of claim 11, further comprising a driving circuit, wherein the driving circuit is coupled to the logic control circuit and the switch main circuit for receiving a driving signal for the logic control circuit and controlling on or off of the main transistor and the auxiliary transistor.

13. A switch control circuit of claim 11, wherein the time-delay circuit comprises a rising edge time-delay circuit, a falling edge time-delay circuit, and an inverter, the rising edge time-delay circuit is coupled to an output terminal of the trigger and a control terminal of the main transistor, the falling edge time-delay circuit is coupled to the output terminal of the trigger and an input terminal of the inverter, and an output terminal of the inverter is coupled to a control terminal of the auxiliary transistor.

14. The switch control circuit of claim 11, wherein the trigger is an RS trigger, a terminal R is coupled to the output of the gate circuit, a terminal S is coupled to the output of the first comparison circuit or the output of the second comparison circuit, and a terminal Q is coupled to the time-delay circuit.

15. The switch control circuit of claim 11, wherein the gate circuit is an AND gate circuit.

16. A switch circuit, comprising:
the switch main circuit, comprising the main transistor and the auxiliary transistor, wherein a load is supplied with power by controlling working states of the main transistor and the auxiliary transistor; and
the switch control circuit according to claim 8, coupled to the switch main circuit.

17. A switch circuit, comprising:
the switch main circuit, comprising the main transistor and the auxiliary transistor, wherein a load is supplied with power by controlling working states of the main transistor and the auxiliary transistor; and
the switch control circuit according to claim 5, coupled to the switch main circuit.

18. The switch control circuit of claim 1, further comprising a third comparator, a positive input terminal of the third comparator receives a reference voltage, a negative input terminal of the third comparator inputs a feedback voltage, and an output terminal of the third comparator is coupled to an input terminal of the current detection circuit.

19. The switch control circuit of claim 1, wherein the current detection circuit comprises an inductor current detection circuit, a fourth comparator, and a fifth comparator, the inductor current detection circuit is coupled to an inductor of the switch main circuit for detecting the inductor current, a positive input terminal of the fourth comparator is coupled to the inductor current detection circuit, a negative input terminal of the fourth comparator receives the instruction current, and the output terminal of the fourth comparator is coupled to the logic control circuit, a positive input terminal of the fifth comparator receives the instruction current, a negative input terminal of the fifth comparator is coupled to the inductor current detection circuit, and an output terminal of the fifth comparator is coupled to a constant on logic control circuit.

20. A switch circuit, comprising:
the switch main circuit, comprising the main transistor and the auxiliary transistor, wherein a load is supplied with power by controlling working states of the main transistor and the auxiliary transistor; and
the switch control circuit according to claim 1, coupled to the switch main circuit.

* * * * *